United States Patent [19]

Bach

[11] Patent Number: 4,978,420
[45] Date of Patent: Dec. 18, 1990

[54] SINGLE CHAMBER VIA ETCH THROUGH A DUAL-LAYER DIELECTRIC

[75] Inventor: Valerie A. Bach, Philomath, Oreg.

[73] Assignee: Hewlett-Packard Company, Palo Alto, Calif.

[21] Appl. No.: 460,421

[22] Filed: Jan. 3, 1990

[51] Int. Cl.[5] .................. B44C 1/22; C03C 15/00; C03C 25/06
[52] U.S. Cl. .................. 156/643; 156/644; 156/646; 156/653; 156/657; 156/659.1; 204/192.37; 252/79.1; 430/317; 437/203; 437/238; 437/241
[58] Field of Search ............... 156/643, 644, 646, 653, 156/656, 657, 659.1, 662; 204/192.37; 427/38, 39; 252/79.1; 430/317, 318; 437/203, 228, 235, 238, 241

[56] References Cited

U.S. PATENT DOCUMENTS

| 3,474,021 | 10/1969 | Davidse et al. | 204/192.37 |
| 4,376,672 | 3/1983 | Wang et al. | 156/644 X |
| 4,420,504 | 12/1983 | Cooper et al. | 156/644 X |
| 4,529,476 | 7/1985 | Kawamoto et al. | 156/643 |
| 4,545,852 | 10/1985 | Barton | 156/643 |
| 4,568,410 | 2/1986 | Thornquist | 252/79.1 X |
| 4,793,897 | 12/1988 | Dunfield et al. | 204/192.37 |

Primary Examiner—William A. Powell

[57] ABSTRACT

Tapered via holes (10) of uniform diameter are formed in a dual-layer ($SiO_2$/SiNi) dielectric (18, 20) used for isolation of metallization layers in an integrated circuit. The method includes forming a photoresist layer (22) atop the nitride layer (20) and patterning the photoresist to define a via hole (24). The nitride and oxide layers are successively plasma etched through the photoresist-defined via holes (24) to form via holes (26, 28) through the dual-layer dielectric to an underlying metal line (16, 17). Etching of the nitride layer is selective to the oxide layer. Etching of the oxide layer is selective to the metal line. The photoresist and nitride layers are etched simultaneously in the presence of oxygen so as to taper the via hole in the nitride. The oxide is etched in the absence of oxygen, producing a tapered sidewall profile (32) extending continuously to the metal.

20 Claims, 1 Drawing Sheet

SINGLE CHAMBER VIA ETCH THROUGH A DUAL-LAYER DIELECTRIC

BACKGROUND OF THE INVENTION

The invention relates generally to etching of dielectric layers in an integrated circuit fabrication process, and more particularly to a technique for etching via holes in a dual-layer dielectric for metallization of the circuit.

In conventional integrated circuit fabrication processes, circuit devices such as transistors are formed in a semiconductor substrate. Metal or other conductive contacts and interconnects are formed over and through a dielectric layer, such as a field oxide layer, deposited over the semiconductor substrate. In large-scale (LSI) and very large-scale (VLSI) integrated circuit technologies, it is common to have multiple layers of metallization forming interconnects over the surface of an integrated circuit. An insulative dielectric is deposited between each metallization layer. Electrical contact vias are formed between metallization layers by forming via holes in the dielectric layer in predetermined locations to expose selected areas of the preceding metal layer for contact by deposition of a succeeding metallization layer.

Conventional integrated circuit metallization processes use either silicon oxide or silicon nitride as the interlayer dielectric material. U.S. Pat. No. 4,545,852 commonly assigned herewith, discloses a dual-layer dielectric process. This dual-layer dielectric provides a number of process advantages but one disadvantage is that etching the via holes through two different layers requires two different etches.

The top layer of the dual dielectric film is plasma-enhanced chemical vapor-deposited (PECVD) silicon nitride and the bottom layer is PECVD silicon oxide. Silicon nitride layers are typically etched in a fluorine-rich plasma etch, while silicon oxide layers are typically etched in a fluorine-deficient fluorocarbon plasma etch. Nitride layers are etched more by chemical reactions while oxide etching generally requires ion bombardment. The chemical etching of silicon nitride results in an isotropic profile of the opening etched into the layer. Ion bombardment of a silicon oxide layer results in what is called an anisotropic, straight-walled profile. As heretofore practiced, these two different etch methods have been carried out in discrete processes and separate etching chambers.

To form via holes in a dual-layer dielectric using these etching techniques requires that the nitride layer be etched in a first step in one processing chamber, transferred to a second processing chamber after via holes have been etched through the nitride layer, and etched in a second processing step to extend the via holes through the oxide layer to expose an upper surface of a metal layer beneath the oxide layer. The separate processes thus require more time, equipment, labor and processing complexity than single-dielectric layer metallization processes. There is also a risk of wafer contamination during transfer between processing chambers.

Another problem that arises generally in forming vias is that metal deposition/coverage down into a straight-walled via hole (vertical anisotropic profile) is difficult. Without proper metal coverage, the integrated circuit will not function properly. Preferably, the via hole should have a sloped sidewall, which is difficult to obtain in a dual-layer dielectric composed of a layer of silicon nitride atop a layer of silicon oxide. Isotropic chemical etching of nitride presents a two-fold problem: One is that the thickness of the nitride layer is typically nonuniform, particularly so in multilayer metallizations. As multiple layers are built up, interconnections and crossovers of interconnections in different layers make the surface uneven. This unevenness is replicated in the PECVD oxide and nitride layers. Conventionally, to reduce unevenness so that a succeeding metallization layer can be more reliably deposited, requires an intervening planarization step. In this step, elevated areas of the nitride layer are thinned. If the nitride layer is chemically etched, as is conventional, then where the nitride layer is thin the chemical etch will continue to etch the nitride laterally underneath the resist layer. Consequently, via holes formed where the nitride film is thin will be larger than those formed where the nitride film is thick. This distribution of via hole sizes across a wafer results in process problems, with metal coverage of the large holes being one of those problems. Even a single oxide layer dielectric via etch generally requires two different etches, an isotropic etch followed by an anisotropic etch, in different etching chambers; otherwise, metal coverage problems will occur.

The prior technique of etching via holes in a dual-layer dielectric generally produces via holes with vertical sidewalls through the nitride layer, a stair-step profile in the upper portion of the oxide layer, and a hole of reduced diameter extending through the oxide layer as shown in dashed lines in FIG. 2.

Accordingly, a need remains for a better method of forming via holes in dual-layer dielectric for the formation of vias. R. C. Langley et al. of Micron Technology recently proposed a one-chamber polycide sandwich etching method of forming polycide hybrid gate structures consisting of a metal silicide on top of polysilicon (Semiconductor International, October 1989, pages 95–97). It would be desirable to have a single chamber via etching process that is effective and reliable to form via holes in a dual-layer dielectric.

SUMMARY OF THE INVENTION

One object of the invention is to improve the formation of via holes in a dual-layer dielectric in connection with metallization of an integrated circuit.

Another object of the invention is to simplify the process of forming via holes in a dual-layer dielectric.

A further object of the invention is to improve the sidewall profile of via holes etched in a dual-layer dielectric formed of successive silicon oxide and silicon nitride layers.

Yet another object is to etch via holes in a dual-layer dielectric over an underlying metal line substantially without etching or oxidizing the upper surface of the metal.

Another object is to reduce the variation of via hole diameter resulting from variations in nitride layer thickness in a dual-layer dielectric.

An additional object of the invention as aforesaid is to fully form via holes in a dual-layer dielectric in a single processing chamber.

The invention is an improved method of forming vias in a dual-layer dielectric including a silicon oxide ($SiO_2$) layer formed on an integrated circuit substrate and a silicon nitride ($SiNi_3$) layer formed on the oxide layer. The method includes forming a photoresist layer atop the nitride layer and patterning the photoresist to define a via hole therein. The nitride and oxide layers are successively etched through the via holes defined in the photoresist layer to form one or more via holes through the dual-layer dielectric. Etching of the nitride layer includes plasma etching the nitride selectively to the oxide layer.

After etching through the nitride layer, the via hole can be extended through the oxide layer down to an upper surface of an underlying metal line by plasma etching selectively to the metal. A metallization layer can then be deposited over the dielectric, including within the via holes to make contact to the underlying metal line. The etching procedure is preferably carried out in substeps in which the chemistry of the plasma is varied to control the etching selectivity. In particular, oxygen can be added for the nitride layer etching substep and reduced or removed for the oxide layer etching substep. A single processing chamber can be used for both etching substeps.

The process can also be controlled to produce a desired via-hole sidewall profile. Preferably, the via hole is formed with a tapered sidewall extending continuously through the nitride and oxide layers to aid in deposition of metal therein. Such control includes anisotropically etching the via hole defined in the photoresist.

The term "substrate" refers generally to a wafer or die having an intermediate integrated circuit structure formed thereon, typically including a silicon or other semiconductor layer having transistor or other semiconductor devices formed therein, a passivating field oxide layer over the semiconductor layer, metal or other conductive contacts extending downward through the oxide layer to the semiconductor layer and interconnects extending laterally over the surface of the passivating layer.

The term "selectively to" can be defined alternatively as "preferentially over." In other words, etching a first material selectively to a second material means that the first material is etched preferentially over the second material being etched.

The foregoing and other objects, features and advantages of the invention will become more readily apparent from the following detailed description of a preferred embodiment which proceeds with reference to the drawings.

DETAILED DESCRIPTION

Figure 1:
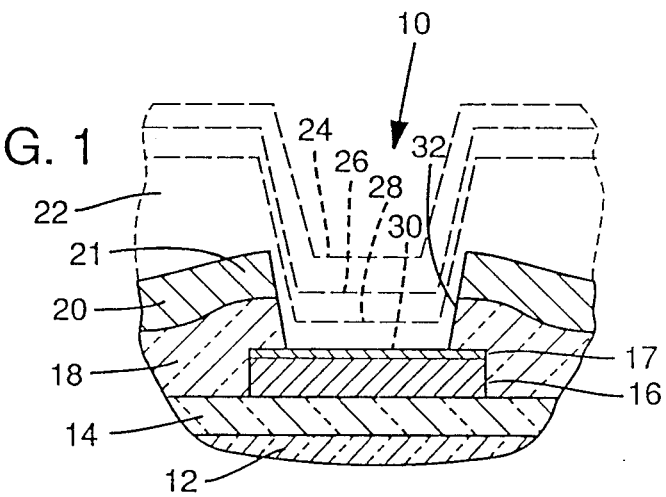
FIG. 1 is a cross-sectional view of a portion of an integrated circuit substrate showing the etching steps in the process of the present invention.
Figure 2:
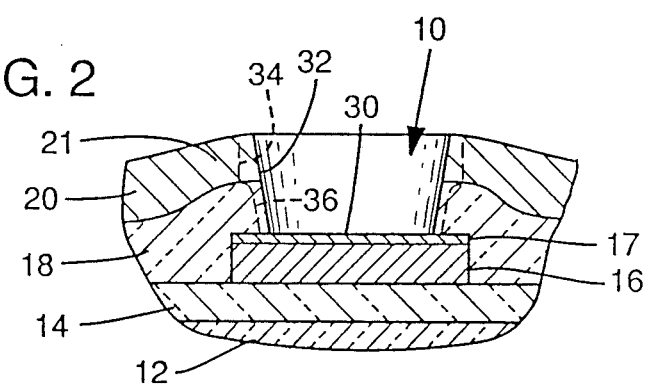
FIG. 2 is a cross-sectional view similar to FIG. 1 showing a via hole fully formed in the dual-layer dielectric in accordance with the invention, dashed lines showing the stair-step sidewall profile produced using the prior art method for comparison with the tapered sidewall profile produced by the present invention.

A via hole 10 is formed in accordance with the invention in an integrated circuit fabricated as shown in part in FIG. 1. Circuit device structures (not shown) are formed in a silicon wafer 12 and intervening areas of the silicon surface are passivated by formation or deposition of a silicon oxide ($SiO_2$) layer 14 (e.g., 5500 angstroms thick). A first layer of metal lines interconnect the circuit devices over the oxide layer. In the preferred embodiment, the metal lines comprise an aluminum (Al/1-%Si) layer 16 (e.g., 5000 angstroms) and an overlying tungsten (W) layer 17 (e.g., 500 angstroms). For purposes of the present invention, the foregoing structure is referred to as the substrate.

A dual-layer dielectric is formed over the first layer metal lines, preferably as described in commonly assigned U.S. Pat. No. 4,545,852, incorporated by reference herein. This dielectric is formed by plasma enhanced chemical vapor deposition (PECVD) of a first, silicon oxide ($SiO_2$) layer 18 (e.g., 5000 angstroms) on the substrate (i.e., over the field oxide 14 and metal lines 16, 17) and of a silicon nitride ($SiN_3$) layer 20 (e.g., 4500 angstroms) on the oxide layer 18. Then the nitride layer is planarized (e.g., by plasma etching). Planarization reduces the thickness of elevated areas of the nitride layer, such as area 21, over underlying metal lines.

Next, a photoresist layer (e.g., 14000 angstroms) is deposited over the exposed wafer surface and patterned to define via holes therein, as indicated in dashed lines 24. The photoresist-defined via holes preferably have an initial upper opening diameter of 1.85 $\mu$m. and a base diameter at the surface of nitride layer 21 of 1.2 $\mu$m.

The wafer is then placed in a processing chamber, such as an LRC 4500 Rainbow oxide etcher manufactured by Lam Research of Fremont, Calif., for etching of the via holes 10 through the dual-layer dielectric to the metal layer 17 in a series of substeps or processes in accordance with the invention.

In a first substep or process, the nitride layer is etched through the photoresist-defined via holes 24 to produce a partial dielectric or nitride-defined via hole therethrough as shown by dashed lines 26. This substep or process is predominantly anisotropic. The photoresist is also etched at approximately the same rate as the nitride so that the sidewalls of the photoresist-defined and nitride-defined via hole gradually widen and assume a profile that is tapered downward and inward. By the time that the nitride layer is etched through to the oxide layer, the base of the partial via hole is about 1.45 $\mu$m. wide at the oxide upper surface. This first etching process is selective to oxide. That is, nitride and photoresist are etched preferentially over oxide, both with a selectivity of about 2.5:1.

Upon detection of an endpoint of the nitride etching step, the oxygen flow is reduced and preferably terminated for the oxide etching processes. Stopping oxygen flow in the oxide etching steps reduces the photoresist etch rate.

In a second substep or process, the oxide layer is etched, as shown in dashed lines 28, with a selectivity to nitride and photoresist, down to metal surface 30. That is, the oxide is etched preferentially over nitride (selectivity about 1.2:1) and over photoresist (selectivity about 2:1). The oxide etch is also highly selective to tungsten (W) layer 17 (approximately 18:1).

In a third substep or process, the oxide is overetched. This step is used to assure that all of the via holes are cleared of the oxide layer. The oxide overetch step is even more selective to nitride (approximately 1.3:1) and photoresist (approximately 3.3:1), and only somewhat less selective for tungsten (approximately 12:1).

Each of the plasma etching processes are controlled so as to form the via hole 10 in the dual-layer dielectric with a sidewall 32 having a profile defining an inward and downward tapered continuous surface. This control includes controlling chemical composition and other conditions of the plasma atmosphere in which the etching processes are performed so as to vary the selectivity of each etching process in turn. Specifically, the plasma etch is controlled initially to etch the photoresist and nitride layers preferentially over the oxide layer, which is thereby exposed within the via hole. Then it is controlled to etch the oxide preferentially over the photoresist and nitride layers and an underlying metal layer.

The feedstock to the plasma reactor includes a flow of a fluorine compound (preferably $CF_4$, alternatively $SF_6$) and a flow of oxygen during the nitride etching process. The addition of oxygen to a $CF_4$ or $SF_6$ plasma chemistry increases the fluorine atom density leading to higher nitride etch rates. Further, an increase in oxygen flow results in a lower oxide etch rate.

The chemical composition is also controlled during the nitride etching process to etch the photoresist layer, mostly by oxidation, simultaneously with etching the nitride layer and at about the same etch rate. The flow of oxygen during the nitride etching process aids in contouring the photoresist-defined via hole to an inward and downward tapered shape. This shape is preserved in subsequent anisotropic oxide etching steps.

Another element of control is the flow rate of inert gas used to form the plasma, preferably argon. The inert gas dilutes the etchant chemistry, and this dilution is changed during the etching processes. Initially, in the example set forth in Table 1 below, the argon flow rate is 1200 sccm (standard cubic centimeters), compared to flow rates of 10 sccm of $CF_4$ and 30 sccm of $O_2$. Simultaneously with changing the gas chemistry to etch oxide preferentially over nitride, the dilution is reduced by half, to 600 sccm argon, with 70 sccm $CF_4$, 30 sccm $CHF_3$ and no oxygen. For the overetch process, dilution is again reduced by about half to 250 sccm, with 25 sccm $CF_4$, 25 sccm $CHF_3$ and again no oxygen.

Control is also exercised over the power supplied to the plasma to aid in varying the selectivity of each etching process to oxide and to nitride, in turn. The power is set in the nitride etching process at a first power level in a range of 325-350 Watts. The photoresist and nitride layers are etched at approximately equal etch rates greater than an etch rate for the oxide layer. The power is set in the oxide etching process at a second, increased power level, about 375 Watts. The etch rate for the oxide layer is increased while the nitride etch rate remains constant. The effect is that selectivity of the oxide etch to nitride is increased.

The integrated circuit substrate includes a first metal layer underlying the dual-layer dielectric. Etching is also controlled to minimize etching of this metal. This includes controlling the etching of the oxide layer so as to be selective to the metal layer. The metal preferably includes a top layer 17 of tungsten, which is highly resistant to the oxide etch and somewhat less resistant to the overetch.

An operative example of the etching gas chemistry and plasma conditions for each etching substep or process is listed in three columns in Table 1. Corresponding experimental results are shown in three columns of Table 2.

TABLE 1

| VIA ETCH RECIPE RF Matching: Load = 6 Tune = 4 | | | |
|---|---|---|---|
| | Nitride Etch | Oxide Etch | Overetch |
| Pressure | 1000 mT | 1200 mT | 500 mT |
| Power | 350 Watts | 375 Watts | 350 Watts |
| RF Frequency | 400 KHz | 400 KHz | 400 KHz |
| RF Load | 339 | 361 | 385 |
| RF Fwd | 360 | 372 | 387 |
| Gas Flows: | | | |
| Argon | 1200 sccm | 600 sccm | 250 sccm |
| CF4 | 10 sccm | 70 sccm | 25 sccm |
| CHF3 | 0 | 30 sccm | 25 sccm |
| O2 | 30 sccm | 0 | 0 |
| Backside He | 13 Torr | 13 Torr | 13 Torr |
| Endpoint Monochrometer | Chn. A 388 nm | Chn. C 483 nm | |
| Trigger (% fraction of baseline) | 70% | 50% | |
| Etch time limits | 65 sec. | 60 sec. | Same as oxide |

Those features of the etching chemistry and conditions having the most effect in the present invention have been discussed above. The etching apparatus includes known chemical detection means for detecting an endpoint to each etching substep or process. The endpoint detection settings and channels used in the LRC 4500 are shown in Table 1. Upon detection of the endpoint of etching of the nitride layer, the second etching substep or process is commenced by changing the gas chemistry. Similarly, the endpoint of oxide etching is detected and used to trigger the overetching process. The duration of the oxide etch is used to time the overetch process. Each process is thus automatically controlled but etch time limits are also programmed as a precaution, as listed in the last line of Table 1. A typical nitride etch time is 45 seconds; typical oxide etch and overetch times are 30 seconds. Pressure and changes in pressure are designed to enhance uniformity of the etching steps and have little effect on the relative etching of different materials. The remaining conditions in Table 1 should be self-explanatory to one skilled in the art.

TABLE 2

| RESULTS | | | |
|---|---|---|---|
| | Nitride Etch | Oxide Etch | Overetch |
| Etch rates: | | | |
| Nitride | 8388 | 6863 | 3584 A./min. |
| Oxide | 3390 | 8398 | 4741 A./min. |
| Resist | 7274 | 3846 | 1429 A./min. |
| Tungsten | | 450 | 440 |
| % Uniformity: | | | |
| Nitride | 5.6 | 3.5 | 4.8 |
| Oxide | 3.6 | 1.0 | 5.0 |
| Selectivity: | | | |
| Nit:Ox | 2.47 | .81 | .75 |
| Nit:PR | 1.15 | 1.78 | 2.51 |
| Ox:PR | .4 | 2.1 | 3.32 |
| Ox:W | | 18.4 | 11.8 |

Table 2 shows that the nitride and resist layers are etched more than the oxide layer under the conditions of the first column of Table 1, and that the oxide is etched more than the nitride and photoresist under the conditions in the second and third columns of Table 1. The principal parameters that effect nitride etching are the power and, to a lesser extent, the flow of oxygen in a plasma atmosphere which includes a suitable etchant, such as $CF_4$ (or $SF_6$). Photoresist etching is primarily determined by the presence or absence of a flow of oxygen but power also affects it to a lesser extent. Oxide etching in the presence of $CF_4$ in a range of 10–50 sccm is most influenced by oxygen flow and plasma power. The underlying metal layer has an upper surface of tungsten, resistant to the oxide and overetch processes of Table 1.

Once via holes 10 are formed, a second layer of metal is deposited over the dual-layer dielectric, including in the via holes in contact with layer 17. This layer can then be patterned to form a second interconnect metallization layer. The procedure of depositing a dual-layer dielectric, planarizing, forming via holes, and depositing and patterning a metal layer can be repeated to form a third interconnect metallization layer.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method of forming vias in a dual-layer dielectric including a silicon oxide layer formed on an integrated circuit substrate and a silicon nitride layer formed on the oxide layer, the method comprising:
   forming a photoresist layer atop the nitride layer;
   patterning the photoresist layer to define a via hole therein; and
   successively etching each of the nitride and oxide layers through the via hole defined in the photoresist layer to form a via hole through the dual-layer dielectric;
   etching the nitride layer including plasma etching the nitride layer selectively to the oxide layer.

2. A method according to claim 1 in which the step of etching the nitride and oxide layers successively is performed in a single, common etching chamber.

3. A method according to claim 1 in which the step of etching the nitride and oxide layers successively includes plasma etching the oxide layer selectively to the nitride layer.

4. A method according to claim 3 wherein the integrated circuit substrate includes a first conductive layer underlying the dual-layer dielectric, the etching of the oxide layer being controlled so as to be selective to the conductive layer.

5. A method according to claim 1 including controlling the etching step so as to form the via hole with a sidewall having a profile defining an inward and downward tapered continuous surface.

6. A method according to claim 5 including depositing a conductive layer atop the dual-layer dielectric including into said via-hole.

7. A method according to claim 1 in which the nitride layer varies in thickness over the substrate so as to include first and second areas of different first and second thicknesses, respectively, the patterning step including defining one of said via holes in the photoresist over each area, the defined via holes having substantially equal diameters, and controlling the nitride layer etching to form via holes therethrough with equal diameters in each area.

8. A method according to claim 1 wherein the integrated circuit substrate includes a first conductive layer underlying the dual-layer dielectric, including depositing a conductive layer atop the dual-layer dielectric including into said via hole.

9. A method according to claim 1 including etching a sidewall of the via hole defined in the photoresist layer to an inward and downward tapered profile.

10. A claim according to claim 9 in which the photoresist and nitride layers are etched as aforesaid in a first continuous etching substep.

11. A claim according to claim 10, the step of successively etching the nitride and oxide layers including plasma etching the oxide layer selectively to the nitride layer in a second etching substep.

12. A method of forming vias in a dual-layer dielectric including a silicon oxide layer formed on an integrated circuit substrate and a silicon nitride layer formed on the oxide layer, the method comprising:
    forming a photoresist layer atop the nitride layer;
    patterning the photoresist layer to define a via hole therein;
    plasma etching each of the nitride and oxide layers in first and second processes through the photoresist-defined via hole to form a via hole through the dual-layer dielectric; and
    controlling each of the plasma etching processes so as to form the via hole in the dual-layer dielectric with a sidewall having a profile defining an inward and downward tapered continuous surface.

13. A method according to claim 12 in which the controlling step includes controlling chemical composition of a plasma atmosphere in which the etching processes are performed so as to vary the selectivity of each etching process to oxide and to nitride, in turn.

14. A method according to claim 13, wherein the chemical composition of the plasma atmosphere includes a flow of a fluorine compound, the controlling step including providing a flow of oxygen during the nitride etching process and reducing the oxygen flow for the oxide etching process.

15. A method according to claim 14 in which the oxygen flow is terminated upon completion of the nitride etching process.

16. A method according to claim 12 in which the controlling step includes controlling chemical composition of a plasma atmosphere in which the etching processes are performed so as to etch the photoresist layer simultaneously with etching the nitride layer.

17. A method according to claim 16 in which the controlling step includes providing a flow of oxygen during the nitride etching process to aid in contouring the photoresist-defined via hole to an inward and downward tapered shape.

18. A method according to claim 12 in which the controlling step includes controlling power of a plasma in which the etching processes are performed so as to vary the selectivity of each etching process to oxide and to nitride, in turn.

19. A method according to claim 18 in which the power is set in the nitride etching process at a first power level such that the photoresist and nitride layers are etched at approximately equal etch rates greater than an etch rate for the oxide layer, and is set in the oxide etching process at a second, increased power level such that the etch rate for the oxide layer is increased.

20. A method according to claim 12, wherein the plasma atmosphere has a chemical composition which includes a flow of a gaseous fluorine etching compound and a flow of oxygen during the nitride etching process and the oxygen flow is reduced and plasma power is increased for the oxide etching process.

* * * * *